(12) United States Patent
Bidenbach et al.

(10) Patent No.: US 8,378,672 B2
(45) Date of Patent: Feb. 19, 2013

(54) SELF-TESTING SENSOR APPARATUS AND METHOD

(75) Inventors: Reiner Bidenbach, Vörstetten (DE); Klaus Heberle, Emmendingen (DE)

(73) Assignee: Micronas GmbH, Freiburg I. Br. (DE)

( * ) Notice: Subject to any disclaimer, the term of this patent is extended or adjusted under 35 U.S.C. 154(b) by 580 days.

(21) Appl. No.: 12/046,833

(22) Filed: Mar. 12, 2008

(65) Prior Publication Data

US 2008/0224694 A1 Sep. 18, 2008

(30) Foreign Application Priority Data

Mar. 12, 2007 (DE) .................. 10 2007 012 214

(51) Int. Cl.
*G01R 33/07* (2006.01)
(52) U.S. Cl. ............... 324/251; 324/225; 703/4; 703/5
(58) Field of Classification Search ................ 324/251
See application file for complete search history.

(56) References Cited

U.S. PATENT DOCUMENTS

| | | | | |
|---|---|---|---|---|
| 6,362,618 | B1 * | 3/2002 | Motz | 324/251 |
| 6,707,298 | B2 * | 3/2004 | Suzuki et al. | 324/252 |
| 7,492,178 | B2 * | 2/2009 | Bidenbach et al. | 324/763 |
| 7,746,065 | B2 * | 6/2010 | Pastre et al. | 324/202 |
| 2008/0238410 | A1* | 10/2008 | Charlier et al. | 324/202 |

FOREIGN PATENT DOCUMENTS

| | | |
|---|---|---|
| DE | 19539458 A1 * | 4/1997 |
| DE | 19606826 A1 | 8/1997 |
| DE | 102005028461 A1 | 12/2006 |

OTHER PUBLICATIONS

Machine English translation of the detailed description for DE 19539458 A1, Noltemeyer et al., obtained from the European Patent Office Website, obtained on Jul. 30, 2010.*

* cited by examiner

*Primary Examiner* — Patrick Assouad
*Assistant Examiner* — David M. Schindler
(74) *Attorney, Agent, or Firm* — Muncy, Geissler, Olds & Lowe, PLLC

(57) ABSTRACT

A semiconductor component on a semiconductor chip comprises at least one sensor element for measuring a physical quantity and an evaluator. The semiconductor component can be switched between a first and a second operating mode. In the first operating mode, the sensor element is sensitive to the physical quantity to be measured and a measurement signal output of the sensor element is connected to an input connection of the evaluator. In the second operating mode, the sensor element is not sensitive to the physical quantity to be measured and/or the signal path between the measurement signal output and the input connection is interrupted. A test signal source for generating a test signal simulating the measurement signal of the sensor element is arranged on the semiconductor chip. In the second operating mode, the test signal source is connected or capable of being connected to the input connection of the evaluator.

11 Claims, 2 Drawing Sheets

SELF-TESTING SENSOR APPARATUS AND METHOD

FIELD OF THE INVENTION

The invention relates to a semiconductor component on a semiconductor chip comprising at least one sensor element for measuring a physical quantity and an evaluator. The invention further relates to a method for testing such a semiconductor component.

BACKGROUND OF THE INVENTION

Such a semiconductor element, which has a magnetic field sensor as a sensor element, is disclosed in DE 10 2005 028 461 A1. In order to be able to check the semiconductor component during manufacture without having to generate a precisely defined magnetic field on the semiconductor component, the semiconductor component has taps for applying a measurement current to the sensor element and taps for measuring a voltage that is generated in the sensor element as a result of the measurement current. In this way it is possible to determine the electrical resistance of the sensor element and thus easily test the sensor element. Since the evaluator disposed downstream of the sensor element is also stimulated by the test signal generated on the sensor element by the test current, a complete electrical check can be performed on the entire signal path, i.e., the magnetic field sensor with the differential current evaluation circuit. However, a disadvantage resides in said semiconductor element in that standard testing devices cannot be used to test the semiconductor component. These standard devices have ferromagnetic components, which could cause the uncontrolled induction of a magnetic field in the magnetic field sensor, thus producing a measurement signal on the magnetic field sensor. This measurement signal overrides the voltage generated by the measurement current and in doing so falsifies the measurement result. To measure the magnetic sensitivity of the semiconductor component, DE 10 2005 028 461 A1 proposes shielding the magnetic field sensor from any external magnetic fields; however, in practice such a shielding cannot be completely achieved. Magnetic shielding also requires rather complex technology.

SUMMARY

The object is therefore to design a semiconductor component of the aforementioned type that can be easily tested using a standard testing device. The object is also to design a method of the aforementioned type for easily testing the functionality of the semiconductor component.

According to the invention, the semiconductor element is capable of being switched between a first and a second operating mode, wherein in the first operating mode the sensor element is sensitive to the physical quantity to be measured and a measurement signal output of the sensor element is connected to an input connection of the evaluator, wherein in the second operating mode the sensor element is not sensitive to the physical quantity to be measured and/or the signal path between the measurement signal output and the input connection is interrupted, wherein a test signal source for generating a test signal simulating the measurement signal of the sensor element is arranged on the semiconductor chip, and wherein in the second operating mode the test signal source is connected or capable of being connected to the input connection of the evaluator. The semiconductor component can then be tested advantageously in the second operating mode without having to maintain or set a specific value for the physical quantity which the sensor element is designed to measure in the vicinity of the semiconductor component. It is also possible to dispense with expensive and complicated means for shielding the sensor element from the physical quantity to be measured, since the sensor element is not sensitive to the physical quantity in the second operating mode. In the second operating mode, the electrical signal path between the sensor element and the evaluator can be interrupted, for example, by at least one switching element. In a sensor element that requires an operating voltage or an operating current for the measurement, however, it is also possible to switch off the operating voltage or the operating current of the sensor element in the second operating mode. If the need arises, both of these means can also be used in combination with each other. However, the evaluator can be tested by inducing a test signal in place of the sensor measurement signal in the evaluator via the test signal source and by measuring an output signal generated by the evaluator as a result of the test signal and if the need arises, comparing it with a prespecified reference signal. The evaluator can thus be checked inexpensively and quickly using the standard testing equipment in a semiconductor factory. An evaluator is to be understood as the complete electrical circuitry of the semiconductor component, excluding the sensor element. The functionality of the sensor element can also be tested if need be in an earlier manufacturing stage of the semiconductor component, especially if the semiconductor chip of the sensor element is arranged in connection with other semiconductor chips on a wafer. A suitable test procedure for the sensor element is described in DE 10 2005 028 461 A1.

It is advantageous if the test signal source has a data memory in which at least one parameter assigned to the sensor element is stored, and if the test signal source is configured so that it generates the test signal depending on the at least one parameter. In particular, the sensitivity of the sensor element to the physical quantity to be measured in the first operating mode can be stored in the data memory as a parameter. It is then possible to simulate the sensor signal very accurately using the test signal and thus test the evaluator even more precisely.

In a preferred embodiment of the invention, the test signal source has a setting mechanism for the test signal, wherein a control input of the setting mechanism for adjusting the test signal is connected directly or indirectly via a control mechanism to an external connection of the semiconductor component. It is thus possible to retrieve precisely defined test signal values at the test signal source in the second operating mode using a testing device connected to the external connection. It is even possible to modify the test signal values depending on the testing device specifications and/or depending on the response of the evaluator to the test signal.

In a functional embodiment of the invention, the setting mechanism is connected to a serial interface on which command codes for adjusting the test signal can be transmitted via the external connection. The data link between the testing device connected to the external connection and the test signal source is then largely not sensitive to EMV radiation.

It is advantageous if the serial interface for switching the operating mode of the semiconductor component is connected to a mode switching mechanism. It is thus possible to dispense with an additional external connection on the semiconductor component for switching the operating mode.

In a preferred embodiment of the invention, the sensor element is a magnetic field sensor, especially a Hall element. It is also conceivable that the sensor element is a pressure sensor or an optical sensor.

In an embodiment, a method for testing a semiconductor element on a semiconductor chip is provided. The semiconductor chip having at least one sensor element for measuring a physical quantity and an evaluator linked to the sensor element via a signal path is advantageous, wherein the signal path between the sensor element and the evaluator is closed or interrupted during a functionality test of the evaluator, wherein a test signal simulating the measurement signal of the sensor element is generated and fed into the evaluator in place of the measurement signal, and wherein at least one output signal of the evaluator dependent on the test signal is measured.

Should the need arise, the measured output signal can then be compared with a reference signal, wherein the semiconductor component, depending on the result of this comparison, is either classified as functional and cleared for measurements of the physical quantity, or excluded as non-functional. Since the signal path between the sensor element and the evaluator is closed or interrupted during a functionality test, the remaining semiconductor component circuitry separated from the sensor element can be checked easily during manufacture by means of a standard testing device.

To test the sensor element, a current flow can be generated in the sensor element and the electrical resistance of the sensor element can be measured. The sensor element can thus be tested for functionality without having to generate a specific value of the physical quality that the sensor element is to measure on the sensor element.

It should further be mentioned that the mode switching mechanism can be connected to an electrical connecting contact preferably arranged on the semiconductor chip and/or on a component housing containing said chip, wherein the mode is capable of being switched by application of an external electric potential on the connecting contact and/or by induction of an electric current in the connecting contact. In doing so it is even possible for a supply voltage needed to power the semiconductor component to be applied to the semiconductor chip, and for the mode switching to take place as a function of the amount of supply voltage applied to the connecting contact.

BRIEF DESCRIPTION OF THE DRAWINGS

In the following, illustrative embodiments of the invention are explained in more detail with reference to the drawing. The following are shown in greater schematic detail in some cases.

DETAILED DESCRIPTION

Figure 1:
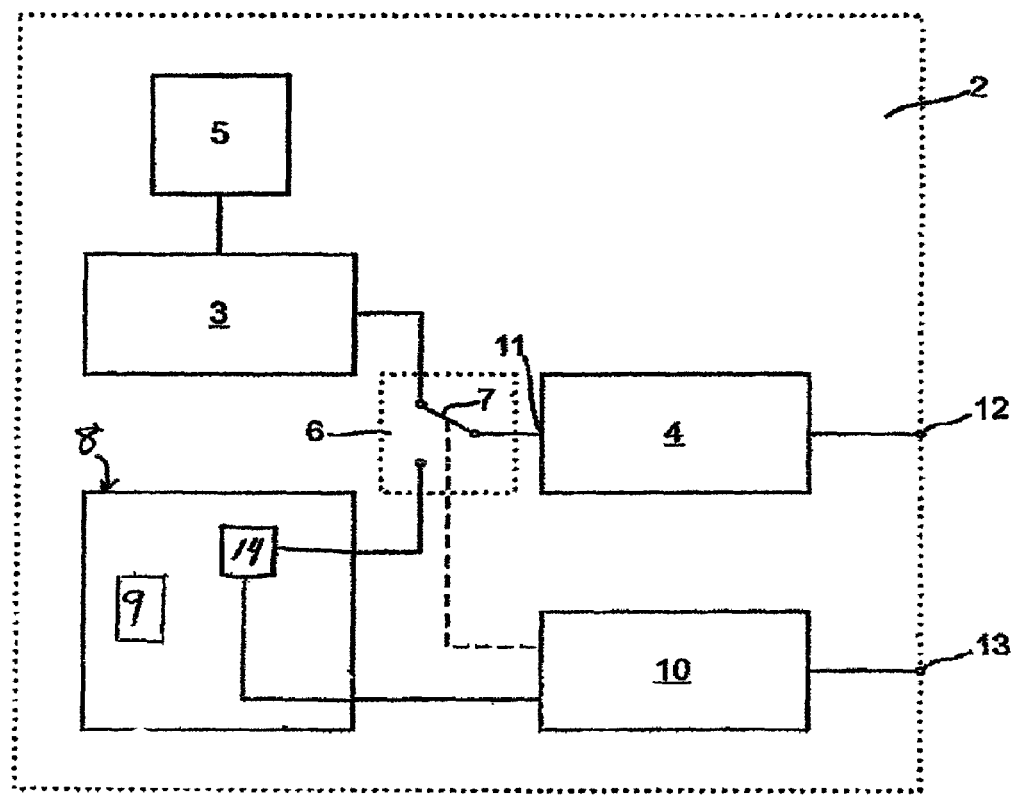
FIG. 1 a block diagram of a first illustrative embodiment of a semiconductor component and FIG. 2 a block diagram of a second illustrative embodiment of the semiconductor component.

A semiconductor component designated in its entirety by 1 in FIG. 1 has a semiconductor chip 2 arranged in a component housing, in which chip a magnetic field-sensitive sensor element 3; namely a Hall plate, and an associated evaluator 4 are integrated. A current source 5 for supplying a Hall plate current to the sensor element 3 is connected to the latter and also integrated in the semiconductor chip 2.

The semiconductor component 1 has a mode switching mechanism 6 by which it can be switched to a first and a second operating mode. In the first operating mode, a measurement signal which is dependent on the magnetic flux density permeating the sensor element 3 resides on a measurement signal output of the sensor element 3. As can be discerned in FIG. 1, the mode switching mechanism 6 has a switching element 7, which in the first operating mode connects the measurement signal output to an input connection 11 of the evaluator 4. The input connection 11 is connected to a connecting contact 12, which is not shown in any greater detail in the drawing; and which is externally accessible on the component housing.

In the second operating mode, the switching element 7 is switched so that the signal path between the measurement signal output of the sensor element 3 and the input connection 11 of the evaluator 4 is interrupted. The input connection 11 is connected to a test signal output of a test signal source 8 via the switching element 7. The test signal source 8 is integrated in the semiconductor chip 2. Other embodiments in which the test signal is generated by an external test signal source and applied to the input connection 11 of the evaluator 4 via connecting contacts provided on the semiconductor component are also conceivable.

The test signal source 8 has a permanent data memory 9 in which a parameter for the sensitivity of the sensor element 3 is stored. The parameter is determined by measurement during the manufacture of the semiconductor wafer from which the semiconductor chip of the sensor element 3 is fabricated. To this end, the semiconductor wafer has taps for connection to a measurement current source. By means of the measurement current source, an electric current is generated and fed via the taps into the sensor element 3. The voltage drop induced by the current flow in the sensor element 3 is measured and the electrical resistance of the sensor element is determined from the current and the voltage drop. The electrical resistance is stored in the data memory 9, which can be a PROM, for example.

The test signal source 8 has a setting mechanism 14, which is not shown in greater detail in the drawing, and by means of which the amplitude of the test signal is adjustable. The setting mechanism 14 is connected via a serial interface 10 to an external connection 13 on the semiconductor component 1. Default values for a magnetic flux density to be simulated can be transmitted via the serial interface 10 to the setting mechanism 14 by a testing device connected to the external connection 13. Depending on the respective default value and the parameter stored in the data memory 8, the amplitude of the test signal is adjusted so that the test signal corresponds to the measurement signal of the sensor element 3 that would reside on the input connection 11 of the evaluator if the semiconductor element 1 were operating in the first mode and if the sensor element 3 were residing in a magnetic field having a magnetic flux value corresponding to the default value. The measurement signal of the sensor element 3 can thus be simulated accurately using the test signal source 8.

Figure 2:
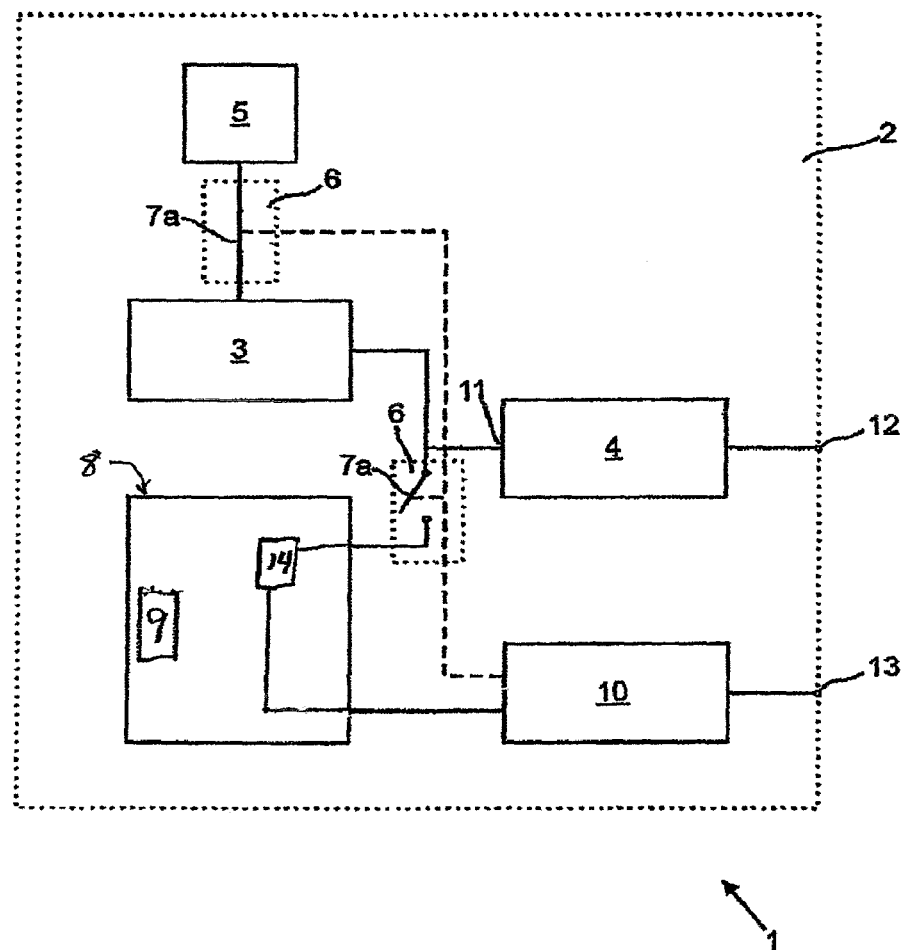

In the illustrative embodiment shown in FIG. 2, in the second operating mode the sensor element 3 is not sensitive to magnetic fields. To this end, the mode switching mechanism 6 comprises a first switching element 7a, via which the current source 5 is connected to a Hall plate current connection of the sensor element 3. In the first operating mode, the first switching element 7a is switched so that the sensor element 3 is permeated by a Hall plate current. In the second operating mode, the current flow to the Hall plate current connection is interrupted.

The mode switching mechanism further comprises a second switching element 7b, which is arranged in the signal path between the test signal output of the test signal source and the input connection 11 of the evaluator 4. The signal path between the test signal output and the input connection 11 of the evaluator 4 is interrupted in the first operating mode, and the test signal output is connected to the input connection 11 of the evaluator 4 in the second operating mode. As in the illustrative embodiment of FIG. 1, the mode of the semiconductor component 1 can be switched via the interface 10.

The invention claimed is:

1. A semiconductor component on a semiconductor chip comprising:
   a sensor element for measuring a physical quantity; and
   an evaluator,
   wherein the semiconductor component is configured to be switched between a first and a second operating mode,
   wherein in the first operating mode the sensor element is sensitive to the physical quantity to be measured and a measurement signal output of the sensor element is connected to an input connection on the evaluator,
   wherein in the second operating mode the sensor element is not sensitive to the physical quantity to be measured and/or the sensor element is isolated from the evaluator,
   wherein a test signal source is configured to generate a test signal simulating the measurement signal of the sensor element, the test signal source being arranged on the semiconductor chip,
   wherein in the second operating mode the test signal source is connected or is connectable to the input connection of the evaluator,
   wherein the sensor element is a Hall element, and
   wherein a Hall current source is disposed on the semiconductor chip, said Hall current source providing current to the Hall element in the first operating mode and not providing current to the Hall element in the second operating mode.

2. The semiconductor component as in claim 1, wherein the test signal source has a data memory in which at least one parameter assigned to the sensor element is stored and in that the test signal source is configured to generate the test signal depending on the at least one parameter.

3. The semiconductor component as in claim 1, wherein the test signal source has a setting mechanism for the test signal, and in that a control input of said setting mechanism for adjusting the test signal is directly or indirectly connected to an external connection of the semiconductor component via a control mechanism.

4. The semiconductor component as in claim 3, wherein the setting mechanism is connected to a serial interface on which command codes for adjusting the test signal can be transmitted via the external connection.

5. The semiconductor component as in claim 4, wherein the serial interface is connected to a mode switching mechanism.

6. A semiconductor component on a semiconductor chip comprising:
   a sensor element for measuring a physical quantity; and
   an evaluator,
   wherein the semiconductor component is configured to be switched between a first and a second operating mode,
   wherein in the first operating mode the sensor element is sensitive to the physical quantity to be measured and a measurement signal output of the sensor element is connected to an input connection on the evaluator,
   wherein in the second operating mode the sensor element is not sensitive to the physical quantity to be measured and/or the sensor element is isolated from the evaluator,
   wherein a test signal source for generating a test signal simulating the measurement signal of the sensor element is arranged on the semiconductor chip,
   wherein in the second operating mode the test signal source is connected or is connectable to the input connection of the evaluator,
   wherein current supply connections of the sensor element are connected to a current source disposed on the semiconductor chip, and
   wherein the current source is switched on in the first operating mode and switched off in the second operating mode.

7. A method for testing a semiconductor component on a semiconductor chip, the method comprising:
   providing a sensor element for measuring a physical quantity and an evaluator connected via a signal path to said sensor element;
   preventing the sensor element from communicating with the evaluator during a functionality test of the evaluator;
   generating a test signal simulating a measurement signal of the sensor element
   inducing the test signal in the evaluator in place of the measurement signal;
   measuring at least one output signal of the evaluator dependent on the test signal; and
   providing a current source on the semiconductor chip, said current source providing current to the sensor element in the first operating mode and not providing current to the sensor element in the second operating mode.

8. The method as in claim 7, wherein a current flow is generated in the sensor element and the electrical resistance of the sensor element is measured in order to test the sensor element.

9. The method according to claim 7 wherein the sensor element is a Hall sensor.

10. A semiconductor component on a semiconductor chip comprising:
    a sensor element configured to measure a physical quantity and having a measurement signal output for providing a measurement signal;
    an evaluator having an input connection;
    a current source;
    a data memory configured to store at least one sensitivity parameter of the sensor element; and
    a test signal source arranged on the semiconductor chip, the test signal source configured to generate a test signal depending on the at least one parameter, the test signal simulating the measurement signal of the sensor element,
    wherein the semiconductor component is configured to be switched between a first and a second operating mode,
    wherein in the first operating mode the sensor element is connected to the current source and is sensitive to the physical quantity to be measured and the measurement signal output of the sensor element is connected to the input connection of the evaluator, and
    wherein in the second operating mode the test signal source is connected to the input connection of the evaluator such that the sensor element is not sensitive to the physical quantity to be measured and the sensor element is isolated from the evaluator.

11. The semiconductor component as in claim 10, wherein the current source is a Hall current source and is configured to provide current to the sensor element in the first operating mode and not providing current to the Hall element in the second operating mode.

* * * * *